(12) United States Patent
Otsuki

(10) Patent No.: US 6,177,693 B1
(45) Date of Patent: Jan. 23, 2001

(54) SEMICONDUCTOR DEVICE

(75) Inventor: Kazutaka Otsuki, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/162,886

(22) Filed: Sep. 30, 1998

(30) Foreign Application Priority Data

Sep. 30, 1997 (JP) .................................................. 9-265582

(51) Int. Cl.$^7$ .................... H01L 27/108; H01L 27/10; H01L 31/119; H01L 31/113

(52) U.S. Cl. .................... 257/296; 257/908; 257/909; 257/391

(58) Field of Search .................... 257/296, 390, 257/314–324, 908–909, 391, 204, 202; 438/257–264

(56) References Cited

U.S. PATENT DOCUMENTS 5,066,997  11/1991  Sakurai et al. .................... 357/45
5,416,350  *  5/1995  Watanabe .................... 257/302

FOREIGN PATENT DOCUMENTS 62-57222  3/1987  (JP) .
8-28467  3/1996  (JP) .

* cited by examiner

Primary Examiner—Tom Thomas
Assistant Examiner—Cuong Q Nguyen
(74) Attorney, Agent, or Firm—Sughrue, Mion, Zinn, Macpeak & Seas, PLLC

(57) ABSTRACT

In a memory cell section of a memory cell array in a semiconductor memory, $N^+$ diffused layers and gate electrode conductors are located with the same line width and with an equal spacing. In a selector section, the $N^+$ diffused layers and the gate electrode conductors are not located with an equal spacing. However, a dummy $N^+$ diffused layer is added to an end of the $N^+$ diffused layer in the selector section. In addition, a dummy $N^+$ diffused layer is additionally located in a region which had existed as an empty region corresponding to the $N^+$ diffused layer in the memory cell section. Thus, a resist pattern for the $N^+$ diffused layers is formed as a designed pattern, and the characteristics of memory cell transistors or selector transistors is homogenized.

8 Claims, 4 Drawing Sheets

SEMICONDUCTOR DEVICE

BACKGROUND OF THE INVENTION

1. Field of the Invention

The present invention relates to a semiconductor device, and more specifically to a semiconductor device having a semiconductor memory formed by locating, in a pattern of diffused layers constituting a memory cell array, a dummy pattern positioned in a region having a low pattern density of diffused layers.

2. Description of Related Art

In general, in most semiconductor devices having a prior art semiconductor memory, a memory cell array constituting the semiconductor memory is formed by repeatedly locating a pattern having the same shape or the same size. For example, a plan view of a flat type mask ROM is shown in FIG. 3. In a memory cell section 11 and a memory cell section 13 within a memory cell array shown in FIG. 3, $N^+$ diffused layers 14 and gate electrode conductors 15 are repeatedly located with the same line width and with an equal spacing. On the other hand, in a selector section 12, the $N^+$ diffused layers 14 and the gate electrode conductors 15 are not located with the equal spacing realized in the memory cell sections 11 and 13.

Because of this, in the semiconductor device formed to have the prior art semiconductor memory, it was an ordinary practice that the pattern density in the selector section 12 of the memory cell array is lower than that in the memory cell sections 11 and 13, as shown in the prior art example of FIG. 3. In the case of forming the pattern of the memory cell array mentioned above, for example, when the $N^+$ diffused layers 14 is formed, a resist is light-exposed in matching with the shape of the $N^+$ diffused layers 14, and thereafter, a developing treatment is carried out to the exposed portion of the resist for patterning the resist, and furthermore, desired $N^+$ diffused layers 14 are formed using as a mask the resist pattern thus obtained.

Incidentally, in FIG. 3, contacts and aluminum interconnections which should be depicted naturally, are omitted, since those do not have a direct relation to the content of the present invention. Furthermore, memory cell transistors and selector transistors formed of the $N^+$ diffused layers are omitted. However, with these omission, generality of the description of this prior art as the background of the invention is never lost.

In the semiconductor device formed as the prior art semiconductor memory mentioned above, since the $N^+$ diffused layers 14 and the gate electrode conductors 15 are not located with an equal spacing in the selector section 12 of the memory cell array, a location relation such as a repeated layout pattern is not adopted. Accordingly, the selector section is ordinarily formed to have the pattern density lower than that of the memory cell sections 11 and 13.

FIG. 4 is a partial enlarged view for illustrating a portion extracted from the memory cell section 11 and the selector section 12 shown in FIG. 3. Because of a low pattern density of the selector section 12 as mentioned above, an occupying area of a remaining resist region in which no $N^+$ diffused layer 14 is to be formed, becomes relatively large, so that at the time of patterning the resist, the remaining resist region relatively greatly contracts in proportion to its area because of a heating in the developing treatment. As a result, as shown in FIG. 4, there are generated resist-removed patterns 17a, 17b and 17c which are larger in shape than an originally designed pattern of $N^+$ diffused layer 14.

Here, in the shown prior art example, it is assumed that, in the originally designed pattern, MOS transistors (1) are formed by using the $N^+$ diffused layers 14 at opposite sides of each of specific places A, C and E in FIG. 4 as a source or a drain, and by using the corresponding gate electrode conductor 15. Furthermore, MOS transistors (2) having the same characteristics as that of the MOS transistors (1) are formed by using the $N^+$ diffused layers 14 at opposite sides of each of specific places B, D and F as a source or a drain, and by using the corresponding gate electrode conductor 15. However, as mentioned above, because of a low pattern density, the resist-removed patterns 17a, 17b and 17c are formed at the position of the corresponding $N^+$ diffused layers 14. Namely, the resist-removed patterns different from the originally designed pattern are formed. This means that although the MOS transistors formed at the specific places A, C and E should, in design, have the same characteristics as those of the MOS transistors formed at the specific places B, D and F, because the resist-removed pattern 17a becomes enlarged, the MOS transistors are actually formed to have different characteristics, and therefore, are deviated from the original design conception.

SUMMARY OF THE INVENTION

Accordingly, it is an object of the present invention to provide a semiconductor device having a semiconductor memory, which has overcome the above mentioned defect.

Another object of the present invention is to provide a semiconductor device having a semiconductor memory, capable of making it possible to form all $N^+$ diffused layers in the memory cell array as an original designed pattern, thereby homogenizing the characteristics of transistors formed in a memory cell section and in a selector section.

In order to achieve the above mentioned objects, a semiconductor device in accordance with the present invention comprising as a semiconductor memory a memory cell array constituted by continuously locating a plurality of unitary memory cell arrays each including as a basic constituent an arbitrary number of basic patterns formed by ion implantation, the memory cell array being constituted by locating and forming a dummy pattern of the basic pattern in a specific region at least having no memory function existing between the unitary memory cell arrays within an occupying zone of the memory cell array.

In addition, the basic patterns can be formed as an $N^+$ diffused layer, and the dummy pattern can be formed as a dummy $N^+$ diffused layer of the $N^+$ diffused layer. The specific region can be formed as a selector function section existing between the unitary memory cell arrays. Furthermore, in the unitary memory cell arrays and the specific region, gate electrode conductors are located perpendicular to the basic patterns. In a region of the unitary memory cell arrays, the basic patterns can have the same width and can be located with an equal spacing. In addition, in the region of the unitary memory cell arrays, the gate electrode conductors can have the same width and can be located with an equal spacing.

DESCRIPTION OF THE PREFERRED EMBODIMENTS

Now, an embodiment of the present invention will be described with the drawings.

Figure 1:
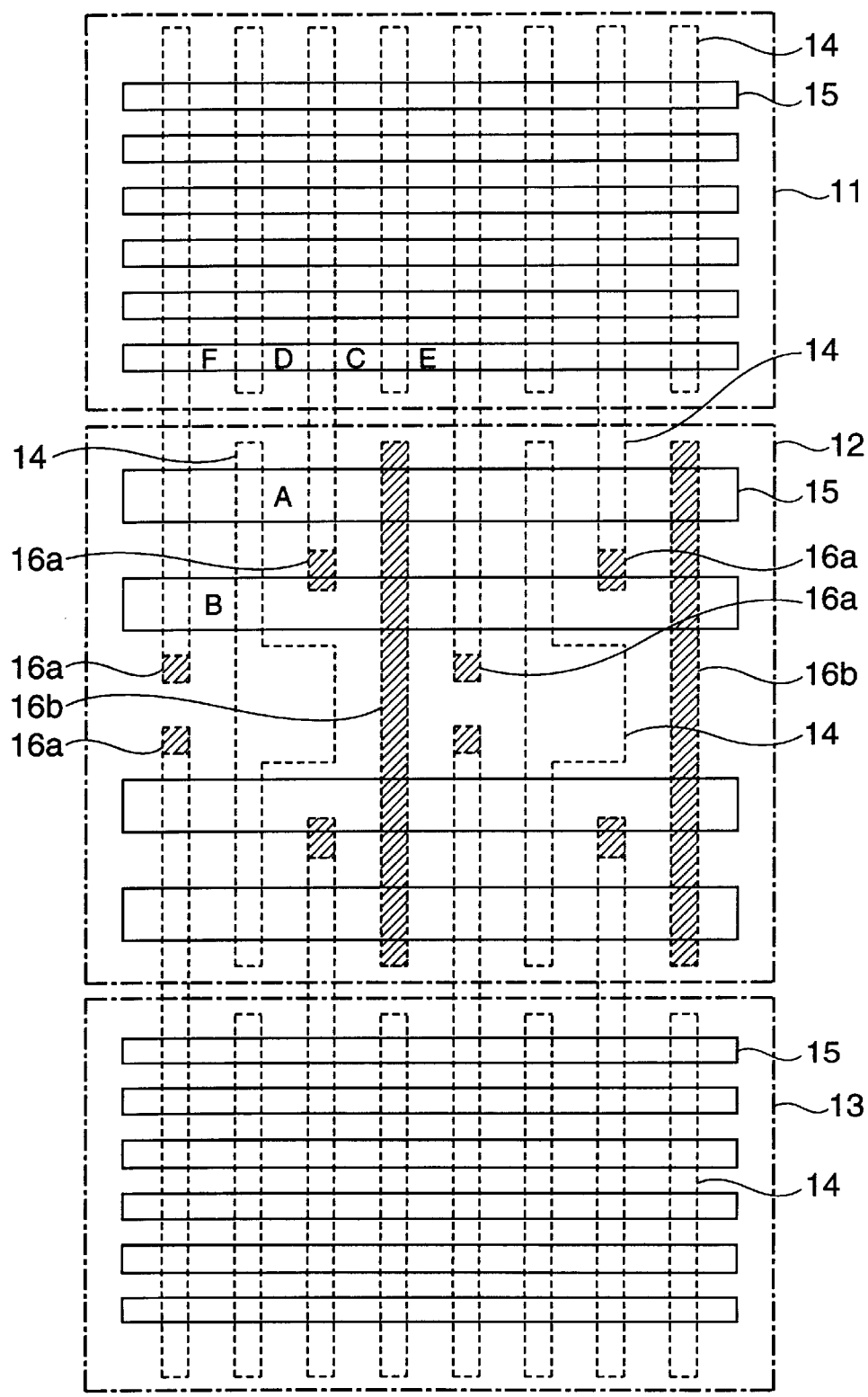
FIG. 1 is a diagram illustrating the layout including the memory cell sections and the selector section, of one embodiment of the memory cell array in accordance with the present invention.
Figure 2:
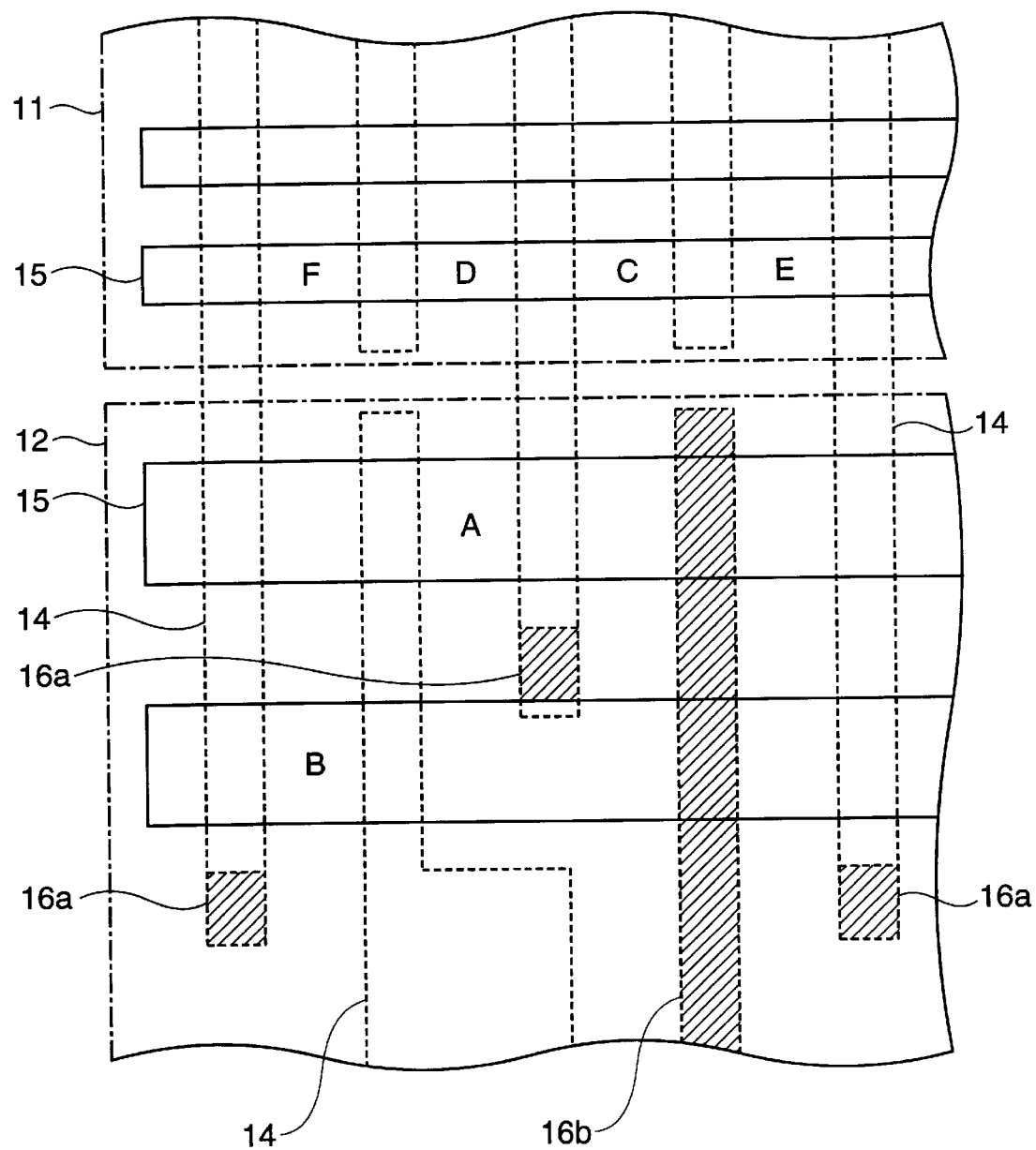
FIG. 2 is a partial enlarged diagram of the embodiment of the present invention shown in FIG. 1.
Figure 3:
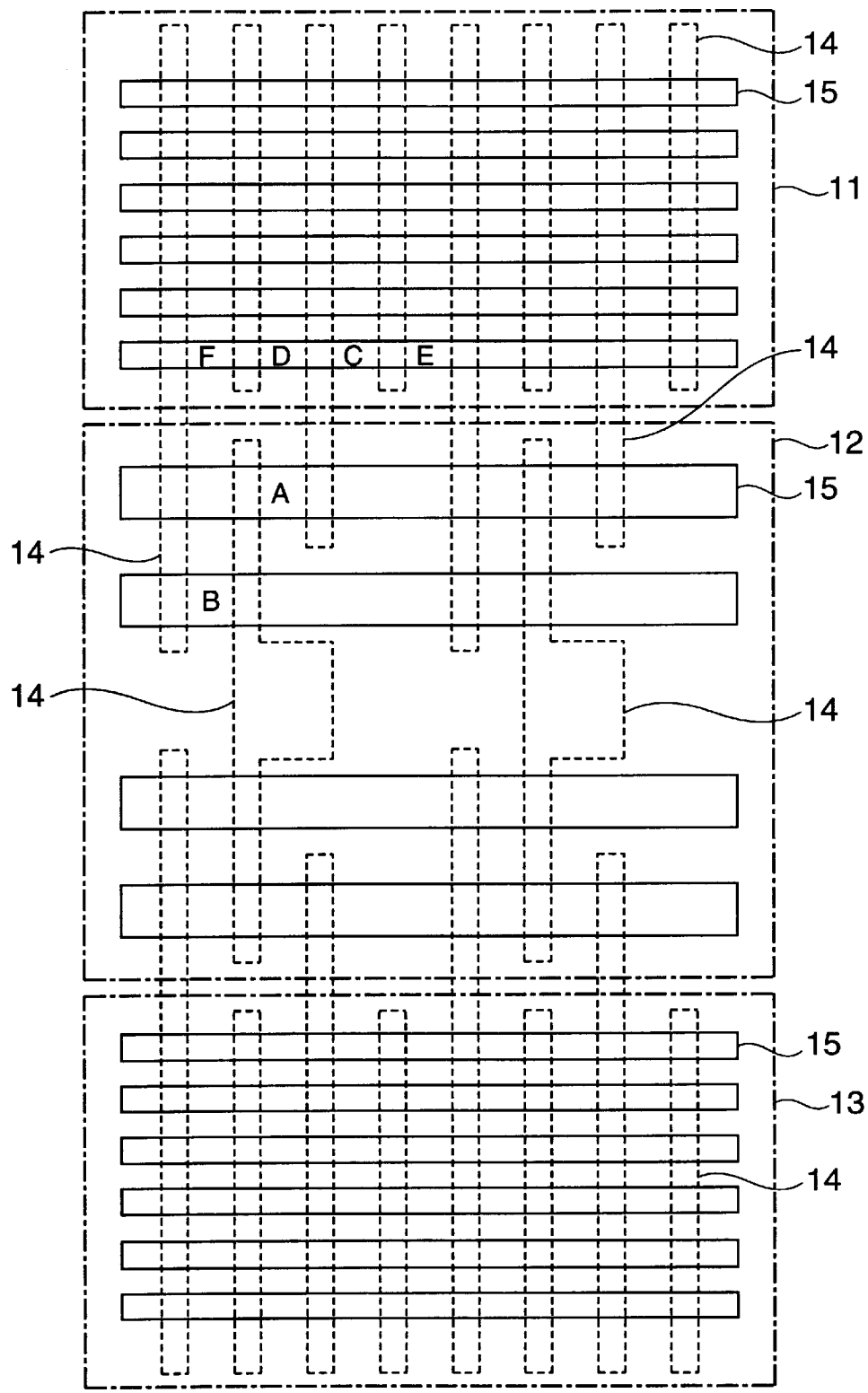
FIG. 3 is a diagram illustrating the layout including the memory cell sections and the selector section, of one example of the prior art memory cell array.

FIG. 1 is a plan view of the memory cell array of the flat type mask ROM, shown as one embodiment of the present invention, and a plan view of the memory cell array obtained by applying the present invention to the above mentioned memory cell array shown in FIG. 3. FIG. 2 is a partial enlarged view for illustrating a portion extracted from the memory cell section 11 and the selector section 12 shown in FIG. 1, and showing a location relation of N$^+$ diffused layers 14 and dummy N$^+$ diffused layers 16a and 16b of this embodiment, which have been improved by applying the present invention, when it is compared with the partial enlarged view of FIG. 4.

As shown in FIG. 1, in the memory cell sections 11 and 13 included within the memory cell array of this embodiment, the N$^+$ diffused layers 14 and gate electrode conductors 15 are located in a repeated pattern having the same line width and an equal spacing. In the selector section 12, the N$^+$ diffused layers 14 and gate electrode conductors 15 are not located with the equal spacing realized in the memory cell sections 11 and 13. However, differently from the prior art example, in the selector section 12 which was formed as a region having a low pattern density, a dummy N$^+$ diffused layer 16a is formed to be newly added at an end of the N$^+$ diffused layers 14. In addition, in the selector section 12, a dummy N$^+$ diffused layer 16b is newly formed in a region which had existed as an empty region corresponding to the N$^+$ diffused layer 14 provided in the memory cell sections 11 and 13.

As mentioned above, with addition of the dummy N$^+$ diffused layers 16a and 16b into the empty region as mentioned above, the empty region corresponding to the remaining resist region no longer exists in the selector section 12, so that the pattern density of the selector section 12 is elevated to become comparable to the pattern density of the memory cell sections 11 and 13. Accordingly, as mentioned above, by adding the dummy N$^+$ diffused layers 16a and 16b to elevate the pattern density of the selector section 12 including the empty region, the contraction of the remaining resist regions is homogenized in the developing treatment for patterning the resist, with the result that the N$^+$ diffused layers are formed as the originally designed pattern, and also, the dummy N$^+$ diffused layers 16a are newly formed in addition to the N$^+$ diffused layers 14 as constituents which constitute MOS transistors including the memory cell transistors and the selector transistors. On the other hand, however, the dummy N$^+$ diffused layers 16b is not used as the constituents which constitute the MOS transistors. Furthermore, with the elevation and homogenization of the pattern density in the empty region of the selector section 12, since the contraction of the remaining resist regions is homogenized in the developing treatment for patterning the resist, it is possible to prevent generation of the resist-removed patterns (as designated with 17a to 17c in FIG. 4) used for forming the N$^+$ diffused layers, which was the problem to be solved in the prior art, and therefore, it becomes possible to form the N$^+$ diffused layers as a desired designed pattern in the memory cell array, with the result that the characteristics of the MOS transistors formed of the N$^+$ diffused layers and the gate electrodes can be homogenized.

Incidentally, in FIGS. 1 and 2, similarly to the prior art example mentioned hereinbefore, contacts and aluminum interconnections which should be depicted naturally, are omitted, since those do not have a direct relation to the content of the present invention. Furthermore, the MOS transistors formed of the N$^+$ diffused layers and the dummy N$^+$ diffused layers are omitted. However, with these omissions, generality of the description of the present invention is never lost.

Figure 4:
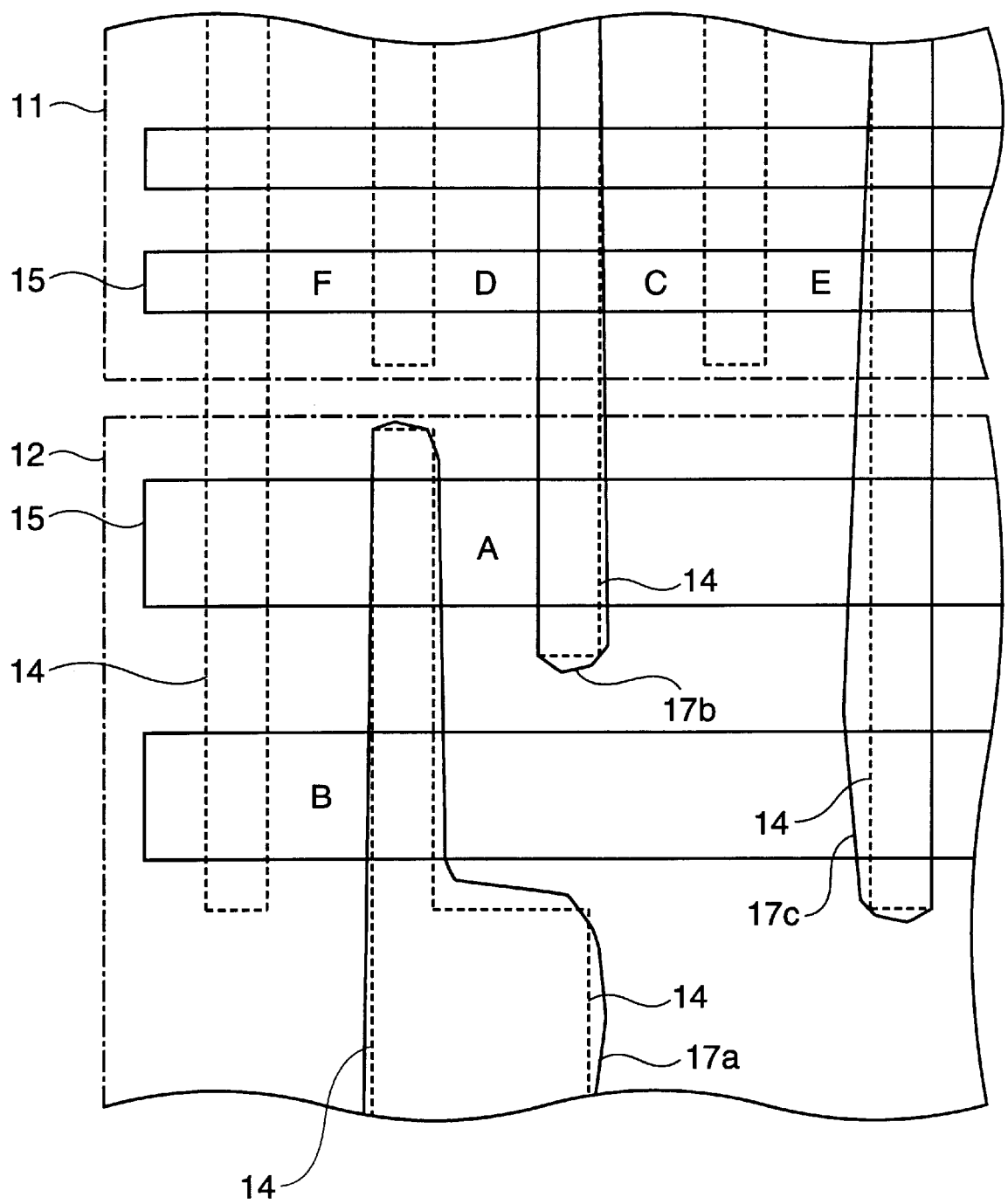
FIG. 4 is a partial enlarged diagram of the prior art example shown in FIG. 3.

As is apparent from the partial enlarged view of FIG. 2 in comparison with the prior art example shown in FIG. 4, the dummy N$^+$ diffused layers 16a and 16b are added in the remaining resist region in which the basic pattern of the selection section 12 did not exist in the prior art example. With this arrangement, the thermal contraction in the remaining resist region is homogenized as mentioned above, so that, as shown in FIG. 2, the resist pattern used for forming the N$^+$ diffused layers which become constituents which constitute the MOS transistors including the memory cell transistors and the selector transistors, is formed as a designed pattern. Accordingly, differently from the prior art mentioned hereinbefore, in the present invention, the MOS transistors formed at the specific places A, C and E can be formed to have the same characteristics as that of the MOS transistors formed at the specific places B, D and F, so that the characteristics of the MOS transistors can be homogenized as mentioned above.

As mentioned above, the present invention is characterized in that the dummy N$^+$ diffused layers are additionally formed in the empty region having no basic pattern, so that the pattern density of the region including the empty region is elevated. As a result, an advantage can be obtained, which can form, as a designed pattern, the resist pattern used for forming the N$^+$ diffused layers which become constituents which constitute the memory cell transistors and the selector transistors.

What is claimed is:

1. A semiconductor device comprising:

a plurality of unitary memory cell arrays each including as a basic constituent an arbitrary number of basic patterns formed by ion implantation, a specific region at least having no memory function, existing between said unitary memory cell arrays, said specific region comprising:

a pattern different from said basic patterns, formed by ion implantation and having a lower pattern density than said basic patterns: and a dummy pattern, formed by ion implantation and proximate to said pattern different from said basic patterns, elevating a pattern density of said specific region to a pattern density comparable to that of said basic patterns.

2. A semiconductor device claimed in claim 1 wherein said basic patterns are formed as an N$^+$ diffused layer, and said dummy pattern is formed as a dummy N$^+$ diffused layer of the N$^+$ diffused layer.

3. A semiconductor device claimed in claim 1 wherein said specific region is formed as a selector function section existing between said unitary memory cell arrays.

4. A semiconductor device claimed in claim 1 wherein in said unitary memory cell arrays and said specific region, gate electrode conductors are located perpendicular to said basic patterns, and in a region of said unitary memory cell arrays, said basic patterns have the same width and are located with an equal spacing.

5. A semiconductor device claimed in claim 4 wherein in said region of said unitary memory cell arrays, said gate electrode conductors have the same width and are located with an equal spacing.

6. A semiconductor device claimed in claim 1 wherein said dummy pattern is not essential to operability of circuitry formed by said pattern different from said basic patterns.

7. A semiconductor device claimed in claim 1 wherein said dummy pattern is not essential to operability of said semiconductor device.

8. A semiconductor device claimed in claim 1 wherein said basic patterns, said pattern different from said basic pattern, and said dummy pattern are all formed at a same layer of said semiconductor device.

* * * * *

UNITED STATES PATENT AND TRADEMARK OFFICE
CERTIFICATE OF CORRECTION

PATENT NO. : 6,177,693 B1
DATED : January 23, 2001
INVENTOR(S) : Kazutaka Otsuki It is certified that error appears in the above-identified patent and that said Letters Patent is hereby corrected as shown below:

<u>Title page,</u>
After "DEVICE" insert -- USING DUMMY PATTERN TO PRESERVE PATTERN DENSITY --

Signed and Sealed this

Thirtieth Day of October, 2001

*Attest:*

NICHOLAS P. GODICI
*Attesting Officer*     *Acting Director of the United States Patent and Trademark Office*